US008981832B2

(12) United States Patent
Yuan et al.

(10) Patent No.: US 8,981,832 B2
(45) Date of Patent: Mar. 17, 2015

(54) AMPLIFICATION SYSTEMS AND METHODS WITH DISTORTION REDUCTIONS

(75) Inventors: Tingzhi Yuan, Shanghai (CN); Yunchao Zhang, Shanghai (CN); Zhiqiang Sun, Shanghai (CN); Lieyi Fang, Shanghai (CN)

(73) Assignee: On-Bright Electronics (Shanghai) Co., Ltd., Shanghai (CN)

(*) Notice: Subject to any disclaimer, the term of this patent is extended or adjusted under 35 U.S.C. 154(b) by 0 days.

(21) Appl. No.: 13/273,061

(22) Filed: Oct. 13, 2011

(65) Prior Publication Data

US 2013/0057331 A1  Mar. 7, 2013

(30) Foreign Application Priority Data

Sep. 6, 2011   (CN) .......................... 2011 1 0268690

(51) Int. Cl.
*G06G 7/19* (2006.01)
*H04R 3/04* (2006.01)

(52) U.S. Cl.
CPC .............. *H04R 3/04* (2013.01); *H04R 2430/01* (2013.01)
USPC ............. 327/336; 327/344; 327/345; 330/10; 330/251

(58) Field of Classification Search
USPC ............ 327/336, 337, 341, 344–345; 330/10, 330/251
See application file for complete search history.

(56) References Cited

U.S. PATENT DOCUMENTS

| 4,599,579 | A | 7/1986 | McCann |
| 4,890,248 | A | 12/1989 | Reinhardt |
| 5,363,055 | A * | 11/1994 | Ribner ................................ 330/9 |
| 5,955,910 | A | 9/1999 | Levin et al. |
| 6,016,075 | A | 1/2000 | Hamo |
| 6,169,440 | B1 * | 1/2001 | Liu ................................ 327/337 |

(Continued)

FOREIGN PATENT DOCUMENTS

| CN | 1992520 A | 7/2007 |
| CN | 101288227 A | 10/2008 |

(Continued)

OTHER PUBLICATIONS

United States Patent and Trademark Office, Notice of Allowance and Fee(s) Due mailed Jun. 6, 2013, in related U.S. Appl. No. 13/273,067.

(Continued)

*Primary Examiner* — Lincoln Donovan
*Assistant Examiner* — Patrick Chen
(74) *Attorney, Agent, or Firm* — Jones Day

(57) ABSTRACT

System and method for integrating an input signal to generate an output signal. The system includes a first integrator configured to receive the input signal and generate an integrated signal based on at least information associated with the input signal, a second integrator configured to receive the integrated signal and generate the output signal based on at least information associated with the integrated signal, and a compensation capacitor coupled to the first integrator and the second integrator. The first integrator includes a first integration capacitor and a first operational amplifier including a first input terminal and a first output terminal, the first integration capacitor being coupled between the first input terminal and the first output terminal. The second integrator includes a second integration capacitor and a second operational amplifier including a second input terminal and a second output terminal.

10 Claims, 9 Drawing Sheets

(56) References Cited

U.S. PATENT DOCUMENTS

| | | |
|---|---|---|
| 6,201,417 B1 | 3/2001 | Blum et al. |
| 6,229,389 B1 | 5/2001 | Pullen et al. |
| 6,975,665 B1 | 12/2005 | McCorkle |
| 6,998,850 B2 * | 2/2006 | Baumgartner ............... 324/522 |
| 7,061,213 B2 | 6/2006 | Yoshida |
| 7,068,095 B2 * | 6/2006 | Bernardon ..................... 330/9 |
| 7,075,353 B1 | 7/2006 | Wan et al. |
| 7,076,070 B2 | 7/2006 | Pearce et al. |
| 7,091,795 B1 | 8/2006 | Tsyrganovich |
| 7,221,216 B2 | 5/2007 | Nguyen |
| 7,279,970 B2 * | 10/2007 | Yokoyama et al. ............. 330/99 |
| 7,345,533 B2 * | 3/2008 | Lee ................................. 330/10 |
| 7,400,191 B2 | 7/2008 | Rodriguez |
| 7,417,497 B2 | 8/2008 | Lee |
| 7,492,219 B1 * | 2/2009 | Cyrusian ....................... 330/10 |
| 7,944,192 B2 | 5/2011 | Moussaoui et al. |
| 8,022,756 B2 | 9/2011 | Walker et al. |
| 8,319,570 B2 | 11/2012 | Wlson |
| 8,351,880 B1 | 1/2013 | Hietala et al. |
| 8,558,609 B2 | 10/2013 | Fang et al. |
| 2006/0008095 A1 * | 1/2006 | Tsuji ............................ 381/104 |
| 2006/0044059 A1 | 3/2006 | Yokoyama et al. |
| 2006/0158246 A1 | 7/2006 | Lee |
| 2007/0040608 A1 * | 2/2007 | Magrath et al. ................ 330/10 |
| 2008/0284508 A1 | 11/2008 | Walker et al. |
| 2009/0072805 A1 | 3/2009 | Yamada |
| 2009/0135694 A1 * | 5/2009 | Wang ......................... 369/53.15 |
| 2009/0160551 A1 * | 6/2009 | Chen et al. ..................... 330/251 |
| 2010/0045356 A1 * | 2/2010 | Berkhout et al. ............. 327/307 |
| 2010/0253427 A1 * | 10/2010 | Chen et al. ..................... 330/251 |
| 2012/0299660 A1 | 11/2012 | Arkiszewski et al. |
| 2014/0003631 A1 | 1/2014 | Fang et al. |

FOREIGN PATENT DOCUMENTS

| | | |
|---|---|---|
| CN | 101663813 A | 3/2010 |
| TW | 201105026 A1 | 10/2001 |
| TW | 200618464 A | 6/2006 |
| TW | M309289 | 4/2007 |
| TW | 201021405 A1 | 6/2010 |
| TW | 201116961 A1 | 5/2011 |

OTHER PUBLICATIONS

Taiwan Patent Office, Office Action mailed Jul. 16, 2014, in Application No. 100137586.

Chinese Patent Office, Office Action mailed Aug. 5, 2014, in Application No. 201110268688.8.

Chinese Patent Office, Office Action mailed Aug. 5, 2014, in Application No. 201110268690.5.

United States Patent and Trademark Office, Notice of Allowance mailed Jul. 14, 2014, in U.S. Appl. No. 14/014,177.

United States Patent and Trademark Office, Corrected Notice of Allowability mailed Aug. 13, 2014, in U.S. Appl. No. 14/014,177.

Cai et al., "The Design of Class D Audio Power Amplifier with PWM Modulation," *Advanced Display*, 127, Aug. 2011, pp. 25-30.

Chinese Patent Office, Office Action mailed Jan. 20, 2014, in Application No. 201310368267.1.

United States Patent and Trademark Office, Notice of Allowance mailed Oct. 6, 2014, in U.S. Appl. No. 14/157,431.

United States Patent and Trademark Office, Notice of Allowance mailed Nov. 19, 2014, in U.S. Appl. No. 14/504,229.

* cited by examiner

AMPLIFICATION SYSTEMS AND METHODS WITH DISTORTION REDUCTIONS

1. CROSS-REFERENCES TO RELATED APPLICATIONS

This application claims priority to Chinese Patent Application No. 201110268690.5, filed Sep. 6, 2011, commonly assigned, incorporated by reference herein for all purposes.

2. BACKGROUND OF THE INVENTION

The present invention is directed to integrated circuits. More particularly, the invention provides distortion reductions to amplification systems. Merely by way of example, the invention has been applied to a Class-D amplifier. But it would be recognized that the invention has a much broader range of applicability.

Usually, a switching amplifier (e.g., a Class-D amplifier) is an amplifier where output transistors are often operated as switches. The Class-D amplifier is widely used in audio amplification, and has power-efficiency advantages over certain linear audio-amplifier classes such as Class A, B, and AB.

FIG. 1 is a simplified conventional diagram showing an amplification system using a Class-D amplifier. The amplification system 100 includes a modulation component 102, a gate driver 104, two transistors 106 and 108, an inductor 110, two capacitors 112 and 114, and an output load 116. For example, the transistor 106 is a P-channel metal-oxide-semiconductor field effect transistor (MOSFET), or an N-channel MOSFET. In another example, the transistor 108 is an N-channel MOSFET. In yet another example, the output load 116 is a speaker. In yet another example, the inductor 110 and the capacitor 112 are included in a low pass filter 130. In yet another example, the modulation component 102, the gate driver 104, and the transistors 106 and 108 are included in a Class-D amplifier 118.

The modulation component 102 receives an input audio signal 120, and generates a modulation signal 122. The gate driver 104 receives the modulation signal 122, and generates in response gate drive signals 124 and 126. The transistors 106 and 108 receive the gate drive signals 124 and 126 respectively, and generate an output voltage signal 128 (e.g., $V_{out}$). The low pass filter 130, together with the blocking capacitor 114, receives the output voltage signal 128, and in response generates an output audio signal 132 to drive the output load 116. The output voltage signal 128 (e.g., $V_{out}$) is fed back to the modulation component 102. For example, the gate drive signal 124 is equal to the gate drive signal 126. In another example, the output audio signal 132 is proportional to the input audio signal 120 in magnitude. In yet another example, the gate drive signals 124 and 126 are logic control signals, and hence the transistors 106 and 108 operate like switches.

But in some situations, as the input audio signal 120 is processed by the modulation component 102, the gate driver 104 and the transistors 106 and 108, certain distortion is introduced into the output voltage signal 128, and thus the quality of the output audio signal 132 is reduced. Usually, the output voltage signal 128 is fed back to the modulation component 102 in order to reduce the distortion. Additionally, the modulation component 102 often includes a first-order integrator or a higher-order integrator (e.g., a second-order integrator) to reduce the distortion. A higher-order integrator usually has a higher gain than a first-order integrator, and performs better in reducing the distortion.

FIG. 2 is a simplified conventional diagram showing certain components of a second-order integrator as part of the modulation component 102. The second-order integrator 200 includes two first-order integrators 214 and 216 connected in series. The first-order integrator 214 includes an operational amplifier 202, a resistor 206, and a capacitor 210. The integrator 216 includes an operational amplifier 204, a resistor 208, and a capacitor 212. The capacitor 210 is coupled between an output terminal and an input terminal of the amplifier 202, and the capacitor 212 is coupled between an output terminal and an input terminal of the amplifier 204.

An input signal 216 is received at the resistor 206, and a signal 224 is generated in response. The operational amplifier 202 receives the signal 224 at one input terminal and a reference signal 220 at the other input terminal, and generates in response a signal 226. The resistor 208 receives the signal 226, and a signal 228 is generated in response. The operational amplifier 204 receives the signal 228 at one input terminal and a reference signal 222 at the other input terminal, and generates in response a signal 218. For example, the reference signal 222 is equal to the reference signal 220.

For example, a small signal transfer function of the integrator 200 is determined according to the following equation:

$$H(s) = \frac{1}{s^2 R_1 R_2 C_1 C_2} \qquad \text{(Equation 1)}$$

where $H(s)$ is the small signal transfer function of the integrator 200, s represents a complex variable of Laplace transform, $R_1$ represents the resistance of the resistor 206, and $R_2$ represents the resistance of the resistor 208. Additionally, $C_1$ represents the capacitance of the capacitor 210, and $C_2$ represents the capacitance of the capacitor 212. According to Equation 1, the transfer function H(s) of the integrator 200 has two poles at which the transfer function H(s) reaches approximately infinity.

FIG. 3 is a simplified conventional diagram showing a Bode plot of the transfer function H(s) of the integrator 200 as part of the modulation component 102. The waveform 302 represents the magnitude of the transfer function H(s) of the integrator 200 as a function of frequency. The waveform 304 represents the phase angle of the transfer function H(s) of the integrator 200 as a function of frequency.

As shown in FIG. 3, the magnitude and the phase angle of the transfer function H(s) of the integrator 200 decrease as the frequency increases. For example, at a frequency 306, the magnitude of the transfer function H(s) of the integrator 200 is 0 dB, and the phase angle of the transfer function H(s) of the integrator 200 is −180°. The phase margin is 0°, and thus the amplifier 118 is often unstable. Hence, zero compensation is usually needed to yield sufficient phase margin in order to keep the amplifier 118 stable.

Furthermore, the saturation of the integrator 200 often causes distortion. FIG. 4 is a simplified conventional timing diagram of the input audio signal 120. The waveform 402 represents the input audio signal 120 as a function of time. For example, the input audio signal 120 has a sinusoidal waveform as shown by the waveform 402, and has a constant period $T_0$. The amplitude of the input audio signal 120 varies periodically over time.

FIG. 5 is a simplified conventional timing diagram of the output audio signal 132 in response to the input audio signal 120 as shown in FIG. 4 for the amplification system 100 that includes the second-order integrator 200. The waveform 502 represents the output audio signal 132 as a function of time. The output audio signal 132 has a period $T_1$ as shown by the waveform 502. For example, the period $T_1$ is approximately the same as the period $T_0$ of the input audio signal 120. The output audio signal 132 generally follows the change of the input audio signal 120 as shown by the waveform 502. But, the output audio signal 132 contains distortions 504 due to the saturation of the integrator 200.

Referring back to FIG. 2, for example, the input signal 216 includes both the input audio signal 120 and the output voltage signal 128 that is fed back to the modulation component 102. In another example, if the input audio signal 120 is not much larger than the output voltage signal 128, the input signal 216 is proportional (e.g., equal) to the input audio signal 120 superimposed with the output signal 128. The second-order integrator 200 receives the input signal 216, and outputs the signal 218 that is within a certain range. But, in yet another example, if the input audio signal 120 is much larger than the output voltage signal 128, the signal 218 output by the integrator 200 is approximately equal to a positive power supply voltage or ground. That is, the integrator 200 becomes saturated. Then, if the input audio signal 120 reduces in magnitude, the response of the system 100 to the change of the input audio signal 120 lags behind due to the saturation of the integrator 200. In yet another example, distortions 504 are hence introduced into the output audio signal 132.

Hence it is highly desirable to improve the techniques of distortion reductions to amplification systems.

3. BRIEF SUMMARY OF THE INVENTION

The present invention is directed to integrated circuits. More particularly, the invention provides distortion reductions to amplification systems. Merely by way of example, the invention has been applied to a Class-D amplifier. But it would be recognized that the invention has a much broader range of applicability.

According to one embodiment, a system for integrating an input signal to generate an output signal includes a first integrator configured to receive the input signal and generate an integrated signal based on at least information associated with the input signal, a second integrator configured to receive the integrated signal and generate the output signal based on at least information associated with the integrated signal, and a compensation capacitor coupled to the first integrator and the second integrator. The first integrator includes a first integration capacitor and a first operational amplifier including a first input terminal and a first output terminal, the first integration capacitor being coupled between the first input terminal and the first output terminal. The second integrator includes a second integration capacitor and a second operational amplifier including a second input terminal and a second output terminal, the second integration capacitor being coupled between the second input terminal and the second output terminal. Additionally, the compensation capacitor includes a first capacitor terminal and a second capacitor terminal, the first capacitor terminal being connected to the first output terminal of the first operational amplifier, the second capacitor terminal being connected to the second input terminal of the second operational amplifier.

According to another embodiment, a system for amplifying a first input signal to generate a first output signal includes a first integrator configured to receive the first input signal and generate a first integrated signal based on at least information associated with the first input signal, a second integrator configured to receive the first integrated signal and generate a second integrated signal based on at least information associated with the first integrated signal, a compensation capacitor coupled to the first integrator and the second integrator, and a modulation and drive component configured to receive the second integrated signal and generate the first output signal. The first integrator includes a first integration capacitor and a first operational amplifier including a first input terminal and a first output terminal, the first integration capacitor being coupled between the first input terminal and the first output terminal. Further, the second integrator includes a second integration capacitor and a second operational amplifier including a second input terminal and a second output terminal, the second integration capacitor being coupled between the second input terminal and the second output terminal. For example, the first input signal includes a second input signal and a second output signal, the second input signal being associated with an audio input signal, the second output signal being associated with the first output signal. In another example, the system is further configured to integrate and modulate the second input signal and the second output signal to generate the first output signal.

According to yet another embodiment, a system for integrating an input signal to generate an output signal includes a first integrator configured to receive the input signal and generate an integrated signal based on at least information associated with the input signal, a second integrator configured to receive the integrated signal and generate the output signal based on at least information associated with the integrated signal, a compensation capacitor coupled to the first integrator and the second integrator, a switch coupled to the compensation capacitor and configured to receive a control signal associated with the output signal, and a first resistor coupled to the switch. The first integrator includes a first integration capacitor and a first operational amplifier including a first input terminal and a first output terminal, the first integration capacitor being coupled between the first input terminal and the first output terminal. The second integrator includes a second integration capacitor and a second operational amplifier including a second input terminal and a second output terminal, the second integration capacitor being coupled between the second input terminal and the second output terminal. Additionally, the compensation capacitor includes a first capacitor terminal and a second capacitor terminal, the first capacitor terminal being connected to the first output terminal of the first operational amplifier, the second capacitor terminal being connected to the second input terminal of the second operational amplifier. The switch is further coupled to the second input terminal of the second operational amplifier. Moreover, the first resistor is further coupled to the second output terminal of the second operational amplifier.

According to yet another embodiment, a system for amplifying a first input signal to generate a first output signal includes a first integrator configured to receive the first input signal and generate a first integrated signal based on at least information associated with the first input signal, a second integrator configured to receive the first integrated signal and generate a second integrated signal based on at least information associated with the first integrated signal, a compensation capacitor coupled to the first integrator and the second integrator, a switch coupled to the compensation capacitor and configured to receive a control signal associated with the second integrated signal, a first resistor coupled to the switch, and a modulation and drive component configured to receive the second integrated signal and generate the first output signal. Additionally, the first integrator includes a first integration capacitor and a first operational amplifier including a first input terminal and a first output terminal, the first integration capacitor being coupled between the first input terminal and the first output terminal. The second integrator includes a second integration capacitor and a second operational amplifier including a second input terminal and a second output terminal, the second integration capacitor being coupled between the second input terminal and the second output terminal. The switch is further coupled to the second input terminal of the second operational amplifier. Moreover, the first resistor is further coupled to the second output terminal of the second operational amplifier. For example, the first input signal includes a second input signal and a second output signal, the second input signal being associated with an audio input signal, the second output signal being associated with the first output signal. In another example, the system is further configured to integrate and modulate the second input signal and the second output signal to generate the first output signal.

Depending upon embodiment, one or more benefits may be achieved. These benefits and various additional objects, features and advantages of the present invention can be fully appreciated with reference to the detailed description and accompanying drawings that follow.

4. BRIEF DESCRIPTION OF THE DRAWINGS

5. DETAILED DESCRIPTION OF THE INVENTION

The present invention is directed to integrated circuits. More particularly, the invention provides distortion reductions to amplification systems. Merely by way of example, the invention has been applied to a Class-D amplifier. But it would be recognized that the invention has a much broader range of applicability.

Figure 6:
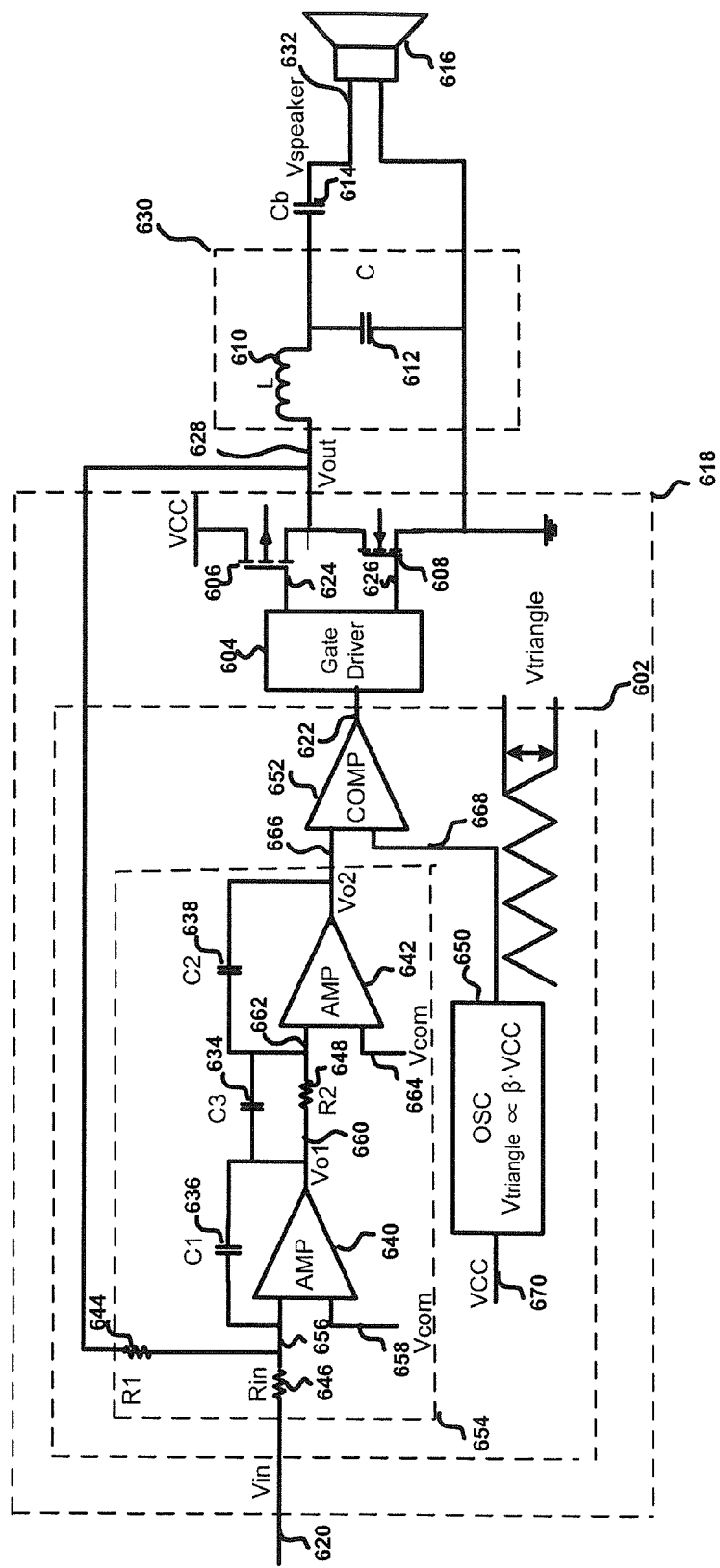
FIG. 6 is a simplified diagram showing an amplification system according to one embodiment of the present invention.

FIG. 6 is a simplified diagram showing an amplification system according to one embodiment of the present invention. This diagram is merely an example, which should not unduly limit the scope of the claims. One of ordinary skill in the art would recognize many variations, alternatives, and modifications.

The amplification system 600 includes a gate driver 604, two transistors 606 and 608, an inductor 610, two capacitors 612 and 614, and an output load 616. Further, the amplification system 600 includes three capacitors 634, 636 and 638, two operational amplifiers 640 and 642, three resistors 644, 646 and 648, a signal generator 650, and a comparator 652.

For example, the capacitors 634, 636 and 638, the operational amplifiers 640 and 642, and the resistors 644, 646 and 648 are included in a second-order integrator 654. In another example, the second-order integrator 654, the comparator 652, and the signal generator 650 are included in a moderation component 602. In yet another example, the transistor 606 is a P-channel metal-oxide-semiconductor field effect transistor (MOSFET), or an N-channel MOSFET. In another example, the transistor 608 is an N-channel MOSFET. In yet another example, the output load 616 is a speaker. In yet another example, the inductor 610 and the capacitor 612 are included in a low pass filter 630. In yet another example, the modulation component 602, the gate driver 604, and the transistors 606 and 608 are included in a Class-D amplifier 618. In yet another example, the capacitor 636 is coupled between an output terminal and an input terminal of the amplifier 640, and the capacitor 638 is coupled between an output terminal and an input terminal of the amplifier 642. In yet another example, the capacitor 634 is coupled to the capacitors 636 and 638, respectively.

According to one embodiment, the modulation component 602 receives an input audio signal 620, and generates a modulation signal 622. For example, the gate driver 604 receives the modulation signal 622, and generates in response gate drive signals 624 and 626. In another example, the transistors 606 and 608 receive the gate drive signals 624 and 626 respectively, and generate an output voltage signal 628 (e.g., $V_{out}$). In yet another example, the low pass filter 630, in combination with the blocking capacitor 614, receives the output voltage signal 628 (e.g., $V_{out}$), and generates in response an output audio signal 632 to drive the output load 616. In yet another example, the output voltage signal 628 (e.g., $V_{out}$) is fed back to the modulation component 602. In yet another example, the gate drive signal 624 is equal to the gate drive signal 626. In yet another example, the output audio signal 632 is proportional to the input audio signal 620 in magnitude. In yet another example, the gate drive signals 624 and 626 are logic control signals, and hence the transistors 606 and 608 operate like switches.

According to another embodiment, within the modulation component 602, the integrator 654 receives the input audio signal 620 and the output voltage signal 628 (e.g., $V_{out}$), and generates in response a signal 666 (e.g., $V_{o2}$). For example, the input audio signal 620 is received at the resistor 646, and the output signal 628 is received at the resistor 644 to generate an output feedback signal. In another example, a signal 656 is generated in response. In yet another example, the operational amplifier 640 receives the signal 656 at one input terminal and a reference signal 658 at another input terminal, and in response generates a signal 660. In yet another example, the resistor 648 receives the signal 660, and a signal 662 is generated in response. In yet another example, the operational amplifier 642 receives the signal 662 at one input terminal and a reference signal 664 at another input terminal, and generates in response the signal 666 (e.g., $V_{o2}$) to be provided to the comparator 652. In yet another example, the reference signal 658 is equal to the reference signal 664. In yet another example, the reference signals 658 and 664 are predetermined voltage levels.

According to yet another embodiment, the comparator 652 receives the signal 666 (e.g., $V_{o2}$) generated by the integrator 654 and a signal 668 generated by the signal generator 650, and generates in response a modulation signal 622 to be provided to the gate driver 604. For example, the signal 668 is generated by the signal generator 650 based on a reference voltage signal 670. In another example, the signal 668 has a triangle waveform. In yet another example, the modulation signal 622 is a pulse-width modulation (PWM) signal.

Figure 1:
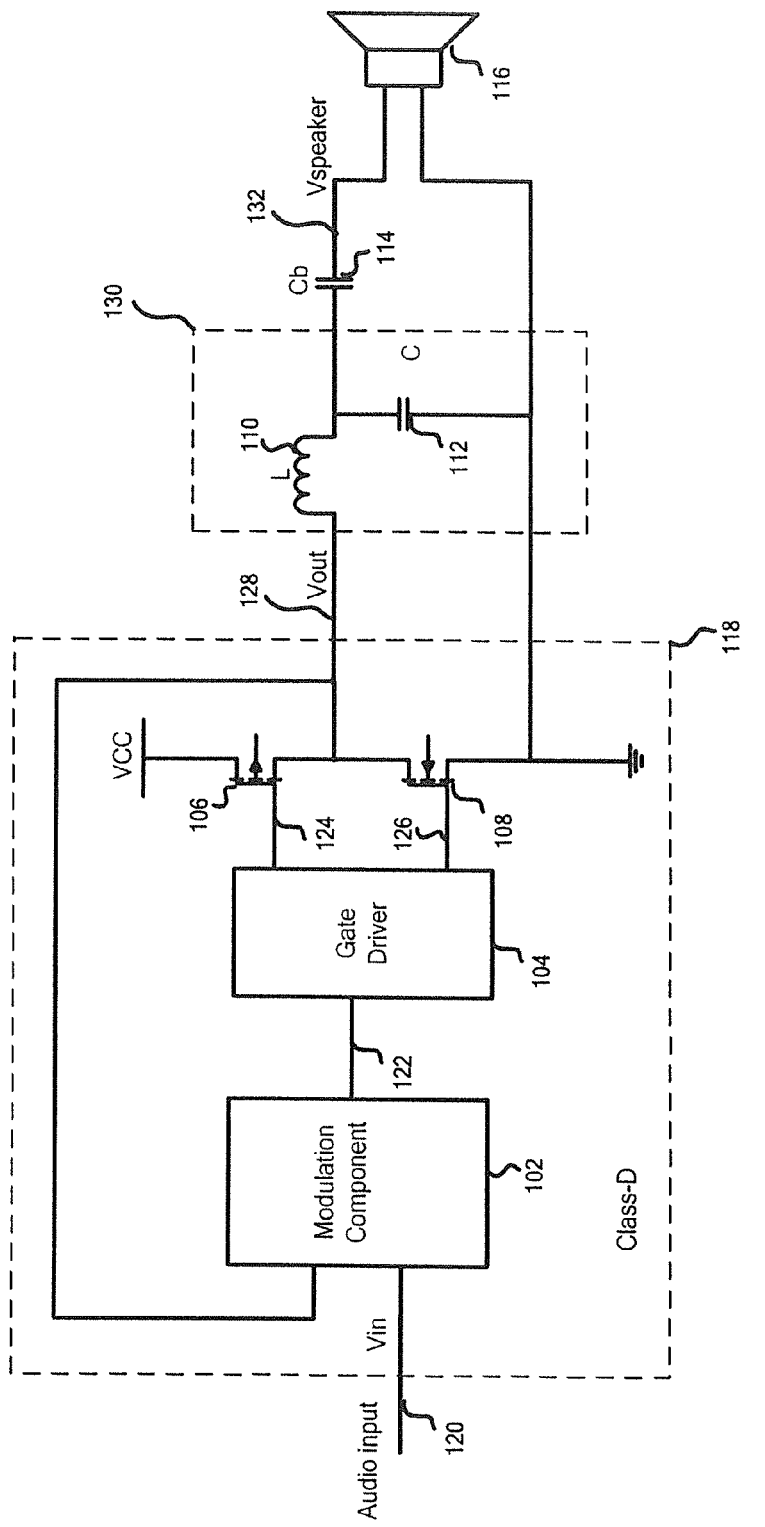
FIG. 1 is a simplified conventional diagram showing an amplification system using a Class-D amplifier.
Figure 2:
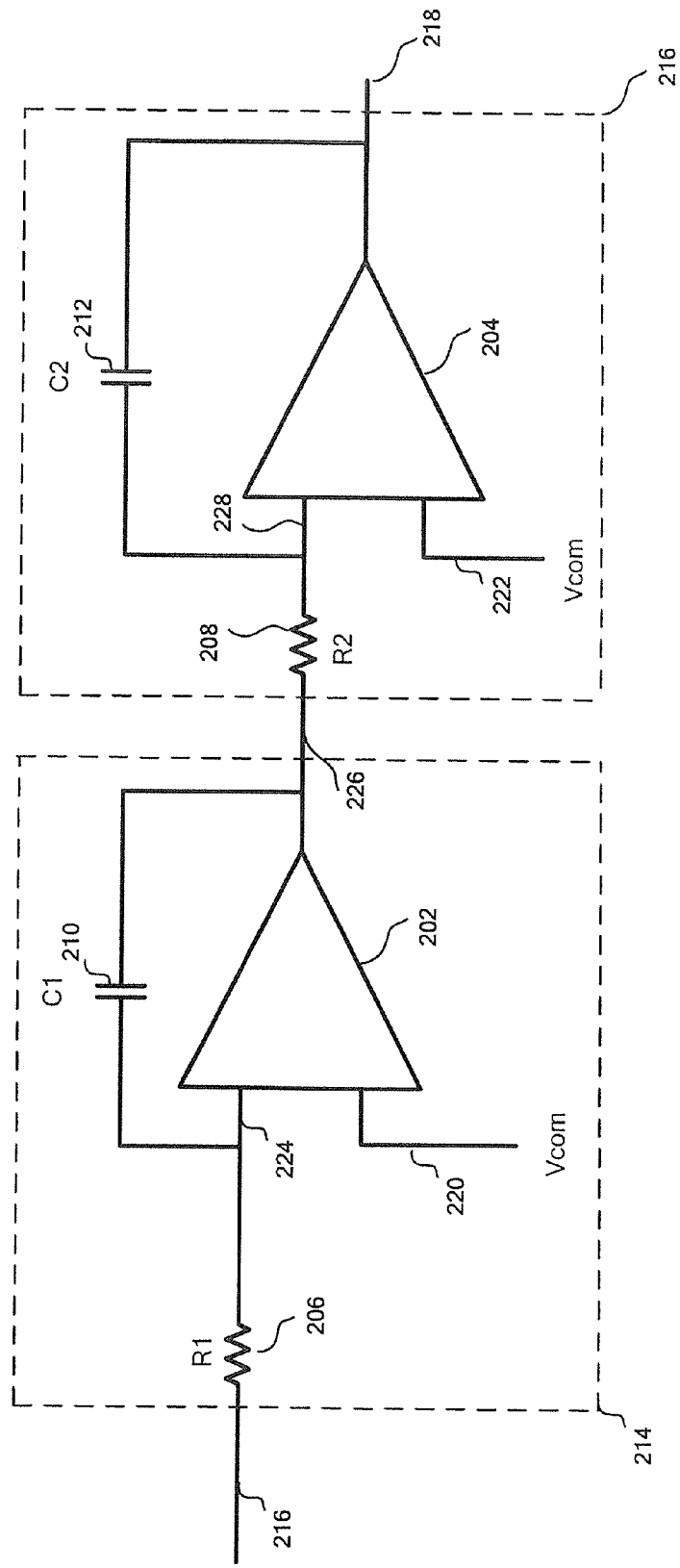
FIG. 2 is a simplified conventional diagram showing certain components of a second-order integrator as part of the modulation component.

Compared with the integrator 200 shown in FIG. 2, the integrator 654 includes an extra capacitor (e.g., the capacitor 634) for zero compensation in order to increase phase margin, according to certain embodiments. For example, a small signal transfer function of the integrator 654 is determined according to the following equation:

$$H(s) = \frac{1 + sR_2C_3}{s^2 R_1 R_2 C_1 C_2} \qquad \text{(Equation 2)}$$

where H(s) is the small signal transfer function of the integrator 654, s represents a complex variable of Laplace transform, $R_1$ represents the resistance of the resistor 644, and $R_2$ represents the resistance of the resistor 648. Additionally, $C_1$ represents the capacitance of the capacitor 636, $C_2$ represents the capacitance of the capacitor 638, and $C_3$ represents the capacitance of the capacitor 634. In another example, according to Equation 2, the small signal transfer function H(s) of the integrator 654 has a zero location caused by the resistor 648 (e.g., $R_2$) and the capacitor 634 (e.g., $C_3$). Hence, a properly selected capacitance of the capacitor 634 (e.g., $C_3$) can provide zero compensation to increase phase margin in order to stabilize the amplifier 618, according to certain embodiments.

According to yet another embodiment, a small signal transfer function of the amplifier 618 is determined according to the following equation:

$$H(s) = \frac{1 + sR_2C_3}{s^2 R_1 R_2 C_1 C_2} K \qquad \text{(Equation 3)}$$

where H(s) is the small signal transfer function of the amplifier 618, s represents a complex variable of Laplace transform, $R_1$ represents the resistance of the resistor 644, and $R_2$ represents the resistance of the resistor 648. Additionally, $C_1$ represents the capacitance of the capacitor 636, $C_2$ represents the capacitance of the capacitor 638, and $C_3$ represents the capacitance of the capacitor 634. Further, K represents the gain from the signal 666 (e.g., $V_{o2}$) to the output voltage signal 628 (e.g., $V_{out}$).

For example, according to Equation 3, the transfer function H(s) of the amplifier 618 has a pair of conjugate poles, and a zero location. In another example, if the amplitude of the signal 668 is constant, K varies with the reference voltage signal 670. In yet another example, the amplitude of the signal 668 is related to (e.g., proportional to) the magnitude of the reference voltage signal 670. Then, K does not vary with the reference voltage signal 670 in order to improve a power supply rejection ratio (PSRR) of the amplifier 618, according to certain embodiments.

A unity gain frequency of the amplifier 618 needs to be large to obtain a proper total harmonic distortion (THD) of the output voltage signal 628 (e.g., $V_{out}$), according to certain embodiments. But, for example, the unity gain frequency of the amplifier 618 needs to satisfy the following equation:

$$f_u \leq \frac{f_{sw}}{\pi} \qquad \text{(Equation 4)}$$

where $f_u$ represents the unity gain frequency of the amplifier 618, and $f_{sw}$ represents a modulation frequency of the amplifier 618. In another example, the unity gain frequency satisfies the following equation in order to obtain a phase margin of at least 60°:

$$\frac{f_u}{f_z} \geq \tan 60° \qquad \text{(Equation 5)}$$

where $f_u$ represents the unity gain frequency of the amplifier 618, and $f_z$ represents a frequency corresponding to the zero location of the transfer function H(s) of the amplifier 618. In yet another example, if a particular modulation frequency of the amplifier 618 (e.g., $f_{sw}$) is selected, the unity gain frequency of the amplifier 618 (e.g., $f_u$) and the frequency corresponding to the zero location of the transfer function H(s) of the amplifier 618 (e.g., $f_z$) can be determined according to Equations 4 and 5.

Then, a frequency corresponding to the conjugate poles of the transfer function H(s) of the amplifier 618 can be determined based on the following equation, according to certain embodiments:

$$20 \log \frac{f_u}{f_z} = 40 \log \frac{f_p}{f_z} \qquad \text{(Equation 6)}$$

where $f_u$ represents the unity gain frequency of the amplifier 618, $f_z$ represents the frequency corresponding to the zero location of the transfer function H(s) of the amplifier 618, and $f_p$ represents the frequency corresponding to the conjugate poles of the transfer function H(s) of the amplifier 618. For example, the capacitance of the capacitors 634, 636 and 638, and the resistance of the resistors 644 and 648 can be determined based on the frequency corresponding to the conjugate poles of the transfer function H(s) of the amplifier 618 (e.g., $f_p$).

Figure 7:
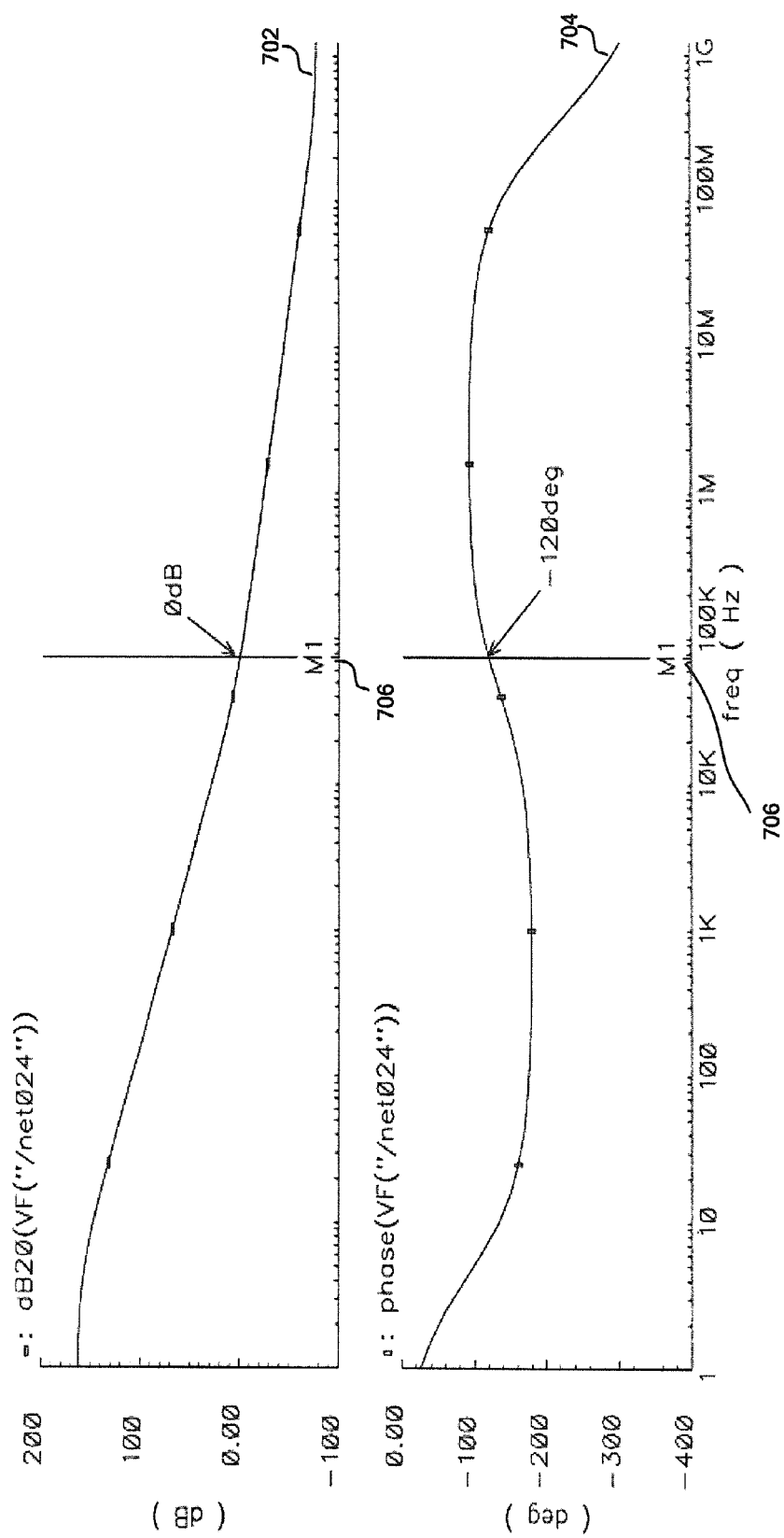
FIG. 7 is a simplified diagram showing a Bode plot of the transfer function H(s) of the integrator according to one embodiment of the present invention.

FIG. 7 is a simplified diagram showing a Bode plot of the transfer function H(s) of the integrator 654 according to one embodiment of the present invention. This diagram is merely an example, which should not unduly limit the scope of the claims. One of ordinary skill in the art would recognize many variations, alternatives, and modifications. The waveform 702 represents the magnitude of the transfer function H(s) of the integrator 654 as a function of frequency. The waveform 704 represents the phase angle of the transfer function H(s) of the integrator 654 as a function of frequency.

Figure 3:
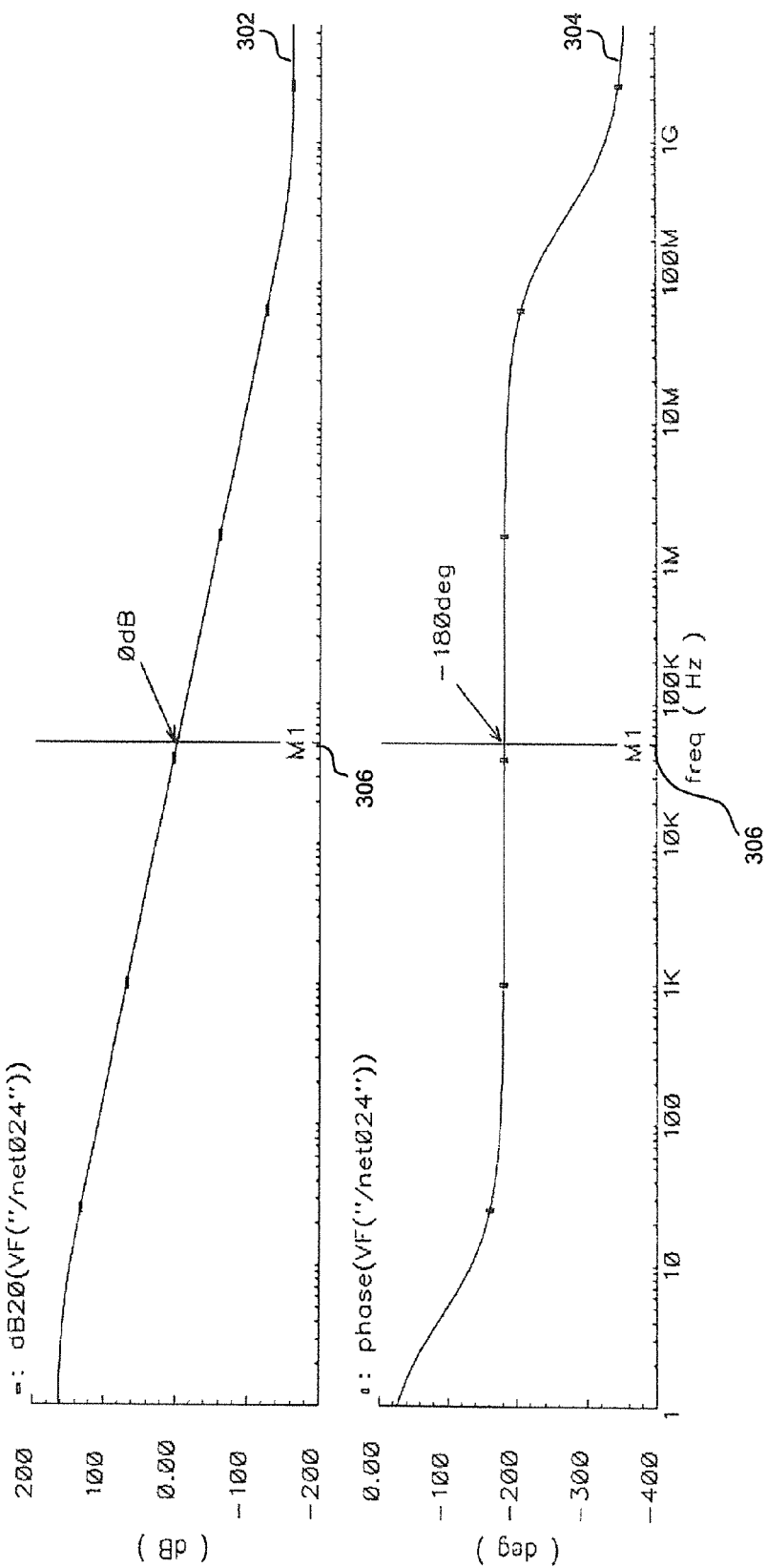
FIG. 3 is a simplified conventional diagram showing a Bode plot of the transfer function H(s) of the integrator as part of the modulation component.

As shown in FIG. 7, the magnitude and the phase angle of the transfer function H(s) of the integrator 654 decrease as the frequency increases. For example, at a frequency 706, the magnitude of the transfer function H(s) of the integrator 654 is 0 dB, and the phase angle of the transfer function H(s) of the integrator 654 is −120°. In another example, the phase margin is 60° for the integrator 654. Compared with FIG. 3, the phase margin increases from 0° (e.g., without zero compensation) to 60° (e.g., with zero compensation). Hence, the amplifier 618, with zero compensation, becomes more stable than the amplifier 118, according to certain embodiments.

Figure 8:
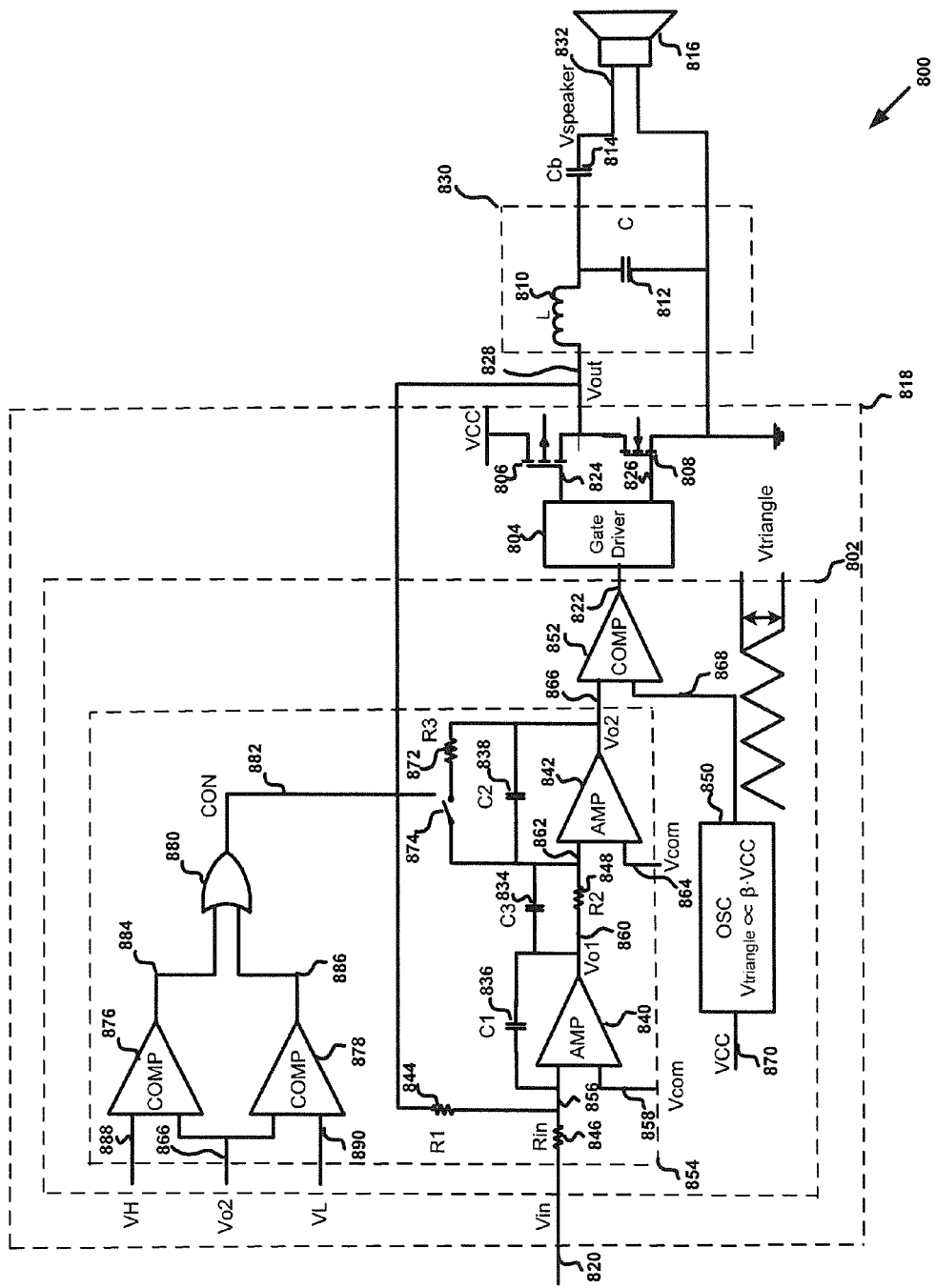
FIG. 8 is a simplified diagram showing an amplification system according to another embodiment of the present invention.

According to some embodiments, saturation of a higher-order integrator needs to be taken into account to reduce distortion as noted above. FIG. 8 is a simplified diagram showing an amplification system according to another embodiment of the present invention. This diagram is merely an example, which should not unduly limit the scope of the claims. One of ordinary skill in the art would recognize many variations, alternatives, and modifications.

The amplification system 800 includes a gate driver 804, two transistors 806 and 808, an inductor 810, two capacitors 812 and 814, and an output load 816. Further, the amplification system 800 includes three capacitors 834, 836 and 838, two operational amplifiers 840 and 842, three resistors 844, 846 and 848, a signal generator 850, and a comparator 852. Additionally, the amplification system 800 includes a resistor 872, a switch 874, two comparators 876 and 878, and an OR gate 880.

For example, the capacitors 834, 836 and 838, the operational amplifiers 840 and 842, the resistors 844, 846, 848 and 872, the switch 874, the comparators 876 and 878, and the OR gate 880 are included in a second-order integrator 854. In another example, the second-order integrator 854, the comparator 852, and the signal generator 850 are included in a moderation component 802. In yet another example, the transistor 806 is a P-channel metal-oxide-semiconductor field effect transistor (MOSFET), or an N-channel MOSFET. In another example, the transistor 808 is an N-channel MOSFET. In yet another example, the output load 816 is a speaker. In yet another example, the inductor 810 and the capacitor 812 are included in a low pass filter 830. In yet another example, the modulation component 802, the gate driver 804, and the transistors 806 and 808 are included in a Class-D amplifier 818. In yet another example, the capacitor 836 is coupled between an output terminal and an input terminal of the amplifier 840, and the capacitor 838 is coupled between an output terminal and an input terminal of the amplifier 842. In yet another example, the capacitor 834 is coupled to the capacitors 836 and 838, respectively.

For example, the gate driver 804, the transistors 806 and 808, the inductor 810, the capacitors 812 and 814, the output load 816 are the same as the gate driver 604, the transistors 606 and 608, the inductor 610, the capacitors 612 and 614, the output load 616. In another example, the capacitors 834, 836 and 838, the operational amplifiers 840 and 842, the resistors 844, 846 and 848, the signal generator 850, and the comparator 852 are the same as the capacitors 634, 636 and 638, the operational amplifiers 640 and 642, the resistors 644, 646 and 648, the signal generator 650, and the comparator 652.

According to one embodiment, the modulation component 802 receives an input audio signal 820, and generates a modulation signal 822. For example, the gate driver 804 receives the modulation signal 822, and generates in response gate drive signals 824 and 826. In another example, the transistors 806 and 808 receive the gate drive signals 824 and 826, respectively, and generate an output voltage signal 828 (e.g., $V_{out}$). In yet another example, the low pass filter 830, together with the blocking capacitor 814, receives the output voltage signal 828 (e.g., $V_{out}$), and generates in response an output audio signal 832 to drive the output load 816. In yet another example, the output voltage signal 828 (e.g., $V_{out}$) is fed back to the modulation component 802. In yet another example, the gate drive signal 824 is equal to the gate drive signal 826. In yet another example, the output audio signal 832 is proportional to the input audio signal 820 in magnitude. In yet another example, the gate drive signals 824 and 826 are logic control signals, and hence the transistors 806 and 808 operate like switches.

According to another embodiment, within the modulation component 802, the integrator 854 receives the input audio signal 820 and the output voltage signal 828 (e.g., $V_{out}$), and generates in response a signal 866 (e.g., $V_{o2}$). For example, the input audio signal 820 is received at the resistor 846, and a signal 856 is generated in response. In another example, the operational amplifier 840 receives the signal 856 at one input terminal and a reference signal 858 at another input terminal, and in response generates a signal 860. In yet another example, the resistor 848 receives the signal 860, and a signal 862 is generated. In yet another example, the reference signal 858 is equal to the reference signal 864. In yet another example, the reference signals 858 and 864 are predetermined voltage levels.

According to yet another embodiment, if the switch 874 is open, the resistor 872 is not coupled in parallel with the capacitor 838. Then, for example, the operational amplifier 842, together with the capacitor 838, receives the signal 862, and generates in response the signal 866 (e.g., $V_{o2}$) to be provided to the comparators 852, 876 and 878. According to yet another embodiment, if the switch 874 is closed, the resistor 872 is coupled in parallel with the capacitor 838. Then, for example, the operational amplifier 842, together with the capacitor 838 and the resistor 872, receives the signal 862, and generates in response the signal 866 (e.g., $V_{o2}$) to be provided to the comparators 852, 876 and 878. In yet another example, whether the switch 874 is open or closed depends on whether the signal 866 is within the range between a reference signal 888 (e.g., $V_H$) and a reference signal 890 (e.g., $V_L$).

According to yet another embodiment, the comparator 876 receives the signal 866 (e.g., $V_{o2}$) at one input terminal and the reference signal 888 (e.g., $V_H$) at another input terminal, and generates in response a signal 884. For example, the comparator 878 receives the signal 866 (e.g., $V_{o2}$) at one input terminal and a reference signal 890 (e.g., $V_L$) at another input terminal, and generates in response a signal 886. In another example, the OR gate 880 receives the signals 884 and 886 generated by the comparator 876 and 878 respectively, and generates in response the signal 882 which controls the status of the switch 874. In yet another example, the reference signal 888 (e.g., $V_H$) is no less than the reference signal 890 (e.g., $V_L$).

According to yet another embodiment, if the signal 866 (e.g., $V_{o2}$) is no larger than the reference signal 888 (e.g., $V_H$) and no less than the reference signal 890 (e.g., $V_L$), both the signal 884 and the signal 886 are at a first logic level (e.g., a logic low level). For example, the signal 882 generated by the OR gate is at the first logic level (e.g., the logic low level). In another example, the switch 874 is open, and the integrator 854 operates as a second-order integrator, similar to the integrator 654.

According to yet another embodiment, if the signal 866 is less than the reference signal 890 (e.g., $V_L$), or larger than the reference signal 888 (e.g., $V_H$), either the signal 884 or the signal 886 is at a second logic level (e.g., a logic high level). For example, the signal 882 generated by the OR gate is at the second logic level (e.g., the logic high level). In another example, the switch 874 is closed, and the resistor 872 is coupled in parallel with the capacitor 838. In yet another example, the gain of the integrator 854 is reduced. In yet another example, the signal 866 (e.g. $V_{o2}$) changes until the signal 866 is no larger than the reference signal 888 (e.g., $V_H$) and no less than the reference signal 890 (e.g., $V_L$). In yet another example, the switch 874 is open, and the integrator 854 operates as a second-order integrator again, according to certain embodiments. Hence, the saturation of the integrator 854 is controlled to reduce distortion.

Figure 9:
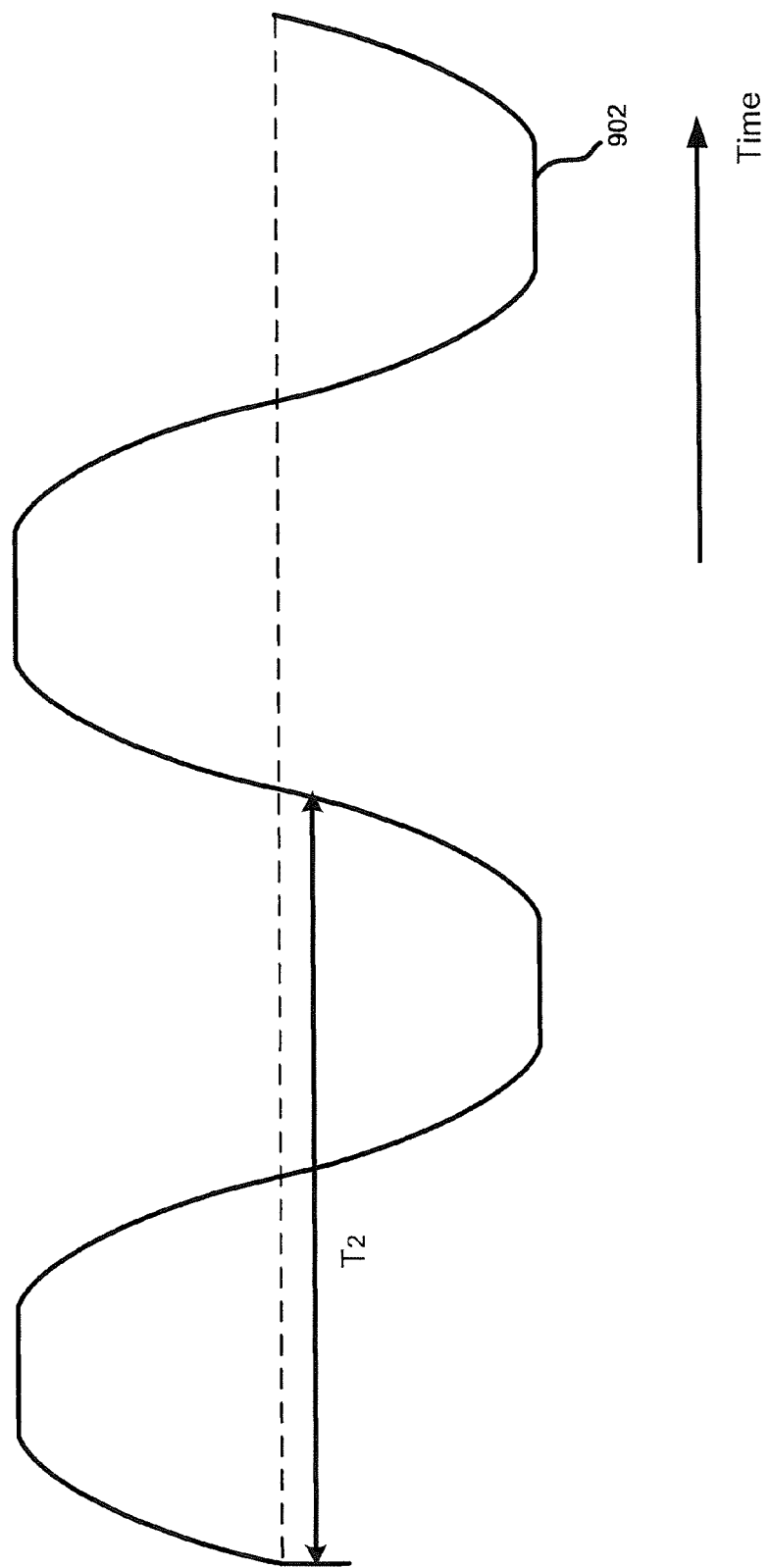
FIG. 9 is a simplified timing diagram of the output audio signal generated by the amplification system according to yet another embodiment of the present invention.

FIG. 9 is a simplified timing diagram of the output audio signal 832 generated by the amplification system 800 according to yet another embodiment of the present invention. This diagram is merely an example, which should not unduly limit the scope of the claims. One of ordinary skill in the art would recognize many variations, alternatives, and modifications. The waveform 902 represents the output audio signal 832 as a function of time.

Figure 4:
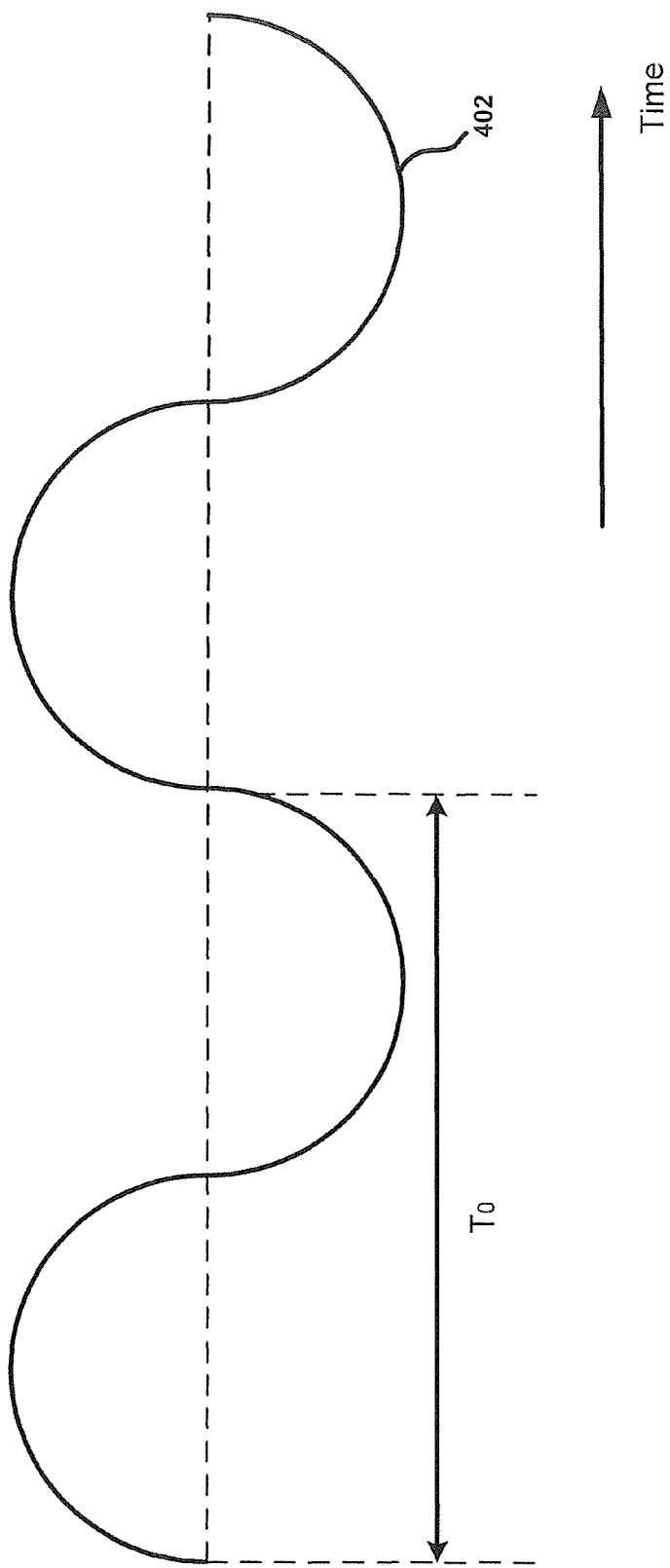
FIG. 4 is a simplified conventional timing diagram of the input audio signal.
Figure 5:
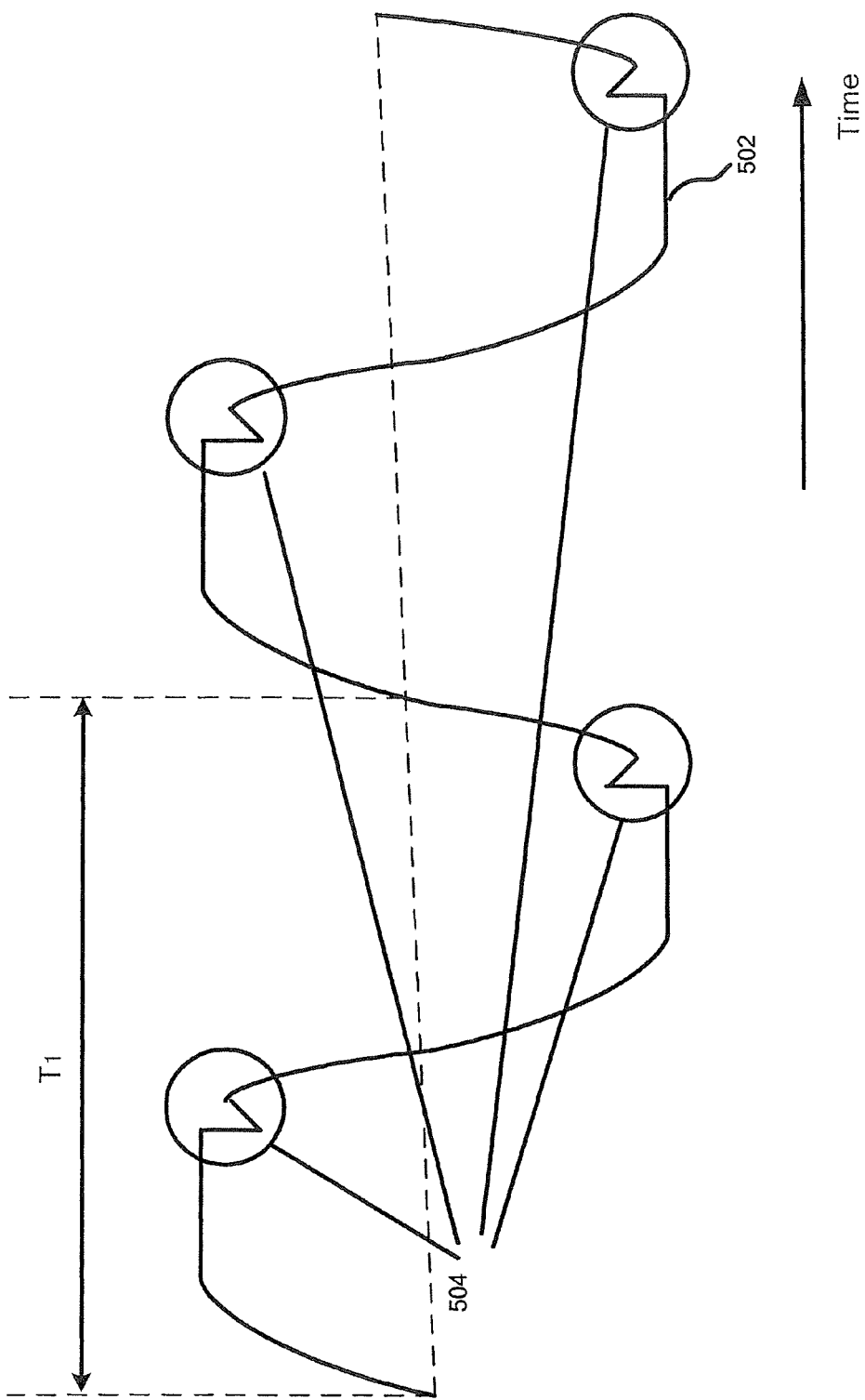
FIG. 5 is a simplified conventional timing diagram of the output audio signal in response to the input audio signal as shown in FIG. 4 for the amplification system that includes the second-order integrator.

According to one embodiment, the input signal 820 is the same as the input audio signal 120, and has a same waveform as the waveform 402 as shown in FIG. 4. For example, the input audio signal 820 has a sinusoidal waveform the same as the waveform 402, and has a constant period $T_0$. In another example, the amplitude of the input audio signal 820 varies periodically over time.

According to another embodiment, the output audio signal 832 has a period $T_2$ as shown by the waveform 902. For example, the period $T_2$ is approximately the same as the period $T_0$ of the input audio signal 820. In another example, the output audio signal 832 generally follows the change of the input audio signal 820 as shown by the waveform 902. In yet another example, the output audio signal 832 does not contain distortions as the output signal 132 does, based on the comparison of the waveforms 502 and 902.

According to another embodiment, a system for integrating an input signal to generate an output signal includes a first integrator configured to receive the input signal and generate an integrated signal based on at least information associated with the input signal, a second integrator configured to receive the integrated signal and generate the output signal based on at least information associated with the integrated signal, and a compensation capacitor coupled to the first integrator and the second integrator. The first integrator includes a first integration capacitor and a first operational amplifier including a first input terminal and a first output terminal, the first integration capacitor being coupled between the first input terminal and the first output terminal. The second integrator includes a second integration capacitor and a second operational amplifier including a second input terminal and a second output terminal, the second integration capacitor being coupled between the second input terminal and the second output terminal. Additionally, the compensation capacitor includes a first capacitor terminal and a second capacitor terminal, the first capacitor terminal being connected to the first output terminal of the first operational amplifier, the second capacitor terminal being connected to the second input terminal of the second operational amplifier. For example, the system is implemented according to FIG. 6, FIG. 7, FIG. 8 and FIG. 9.

According to another embodiment, a system for amplifying a first input signal to generate a first output signal includes a first integrator configured to receive the first input signal and generate a first integrated signal based on at least information associated with the first input signal, a second integrator configured to receive the first integrated signal and generate a second integrated signal based on at least information associated with the first integrated signal, a compensation capacitor coupled to the first integrator and the second integrator, and a modulation and drive component configured to receive the second integrated signal and generate the first output signal. The first integrator includes a first integration capacitor and a first operational amplifier including a first input terminal and a first output terminal, the first integration capacitor being coupled between the first input terminal and the first output terminal. Further, the second integrator includes a second integration capacitor and a second operational amplifier including a second input terminal and a second output terminal, the second integration capacitor being coupled between the second input terminal and the second output terminal. For example, the first input signal includes a second input signal and a second output signal, the second input signal being associated with an audio input signal, the second output signal being associated with the first output signal. In another example, the system is further configured to integrate and modulate the second input signal and the second output signal to generate the first output signal. In yet another example, the system is implemented according to FIG. 6, FIG. 7, FIG. 8 and FIG. 9.

According to yet another embodiment, a system for integrating an input signal to generate an output signal includes a first integrator configured to receive the input signal and generate an integrated signal based on at least information associated with the input signal, a second integrator configured to receive the integrated signal and generate the output signal based on at least information associated with the integrated signal, a compensation capacitor coupled to the first integrator and the second integrator, a switch coupled to the compensation capacitor and configured to receive a control signal associated with the output signal, and a first resistor coupled to the switch. The first integrator includes a first integration capacitor and a first operational amplifier including a first input terminal and a first output terminal, the first integration capacitor being coupled between the first input terminal and the first output terminal. The second integrator includes a second integration capacitor and a second operational amplifier including a second input terminal and a second output terminal, the second integration capacitor being coupled between the second input terminal and the second output terminal. Additionally, the compensation capacitor includes a first capacitor terminal and a second capacitor terminal, the first capacitor terminal being connected to the first output terminal of the first operational amplifier, the second capacitor terminal being connected to the second input terminal of the second operational amplifier. The switch is further coupled to the second input terminal of the second operational amplifier. Moreover, the first resistor is further coupled to the second output terminal of the second operational amplifier. For example, the system is implemented according to at least FIG. 8 and FIG. 9.

According to yet another embodiment, a system for amplifying a first input signal to generate a first output signal includes a first integrator configured to receive the first input signal and generate a first integrated signal based on at least information associated with the first input signal, a second integrator configured to receive the first integrated signal and generate a second integrated signal based on at least information associated with the first integrated signal, a compensation capacitor coupled to the first integrator and the second integrator, a switch coupled to the compensation capacitor and configured to receive a control signal associated with the second integrated signal, a first resistor coupled to the switch, and a modulation and drive component configured to receive the second integrated signal and generate the first output signal. Additionally, the first integrator includes a first integration capacitor and a first operational amplifier including a first input terminal and a first output terminal, the first integration capacitor being coupled between the first input terminal and the first output terminal. The second integrator includes a second integration capacitor and a second operational amplifier including a second input terminal and a second output terminal, the second integration capacitor being coupled between the second input terminal and the second output terminal. The switch is further coupled to the second input terminal of the second operational amplifier. Moreover, the first resistor is further coupled to the second output terminal of the second operational amplifier. For example, the first input signal includes a second input signal and a second output signal, the second input signal being associated with an audio input signal, the second output signal being associated with the first output signal. In another example, the system is further configured to integrate and modulate the second input signal and the second output signal to generate the first output signal. In yet another example, the system is implemented according to at least FIG. 8 and FIG. 9.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits. In yet another example, various embodiments and/or examples of the present invention can be combined.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for integrating an input signal to generate an output signal, the system comprising:
    a first integrator configured to receive an input signal and generate an integrated signal based on at least information associated with the input signal;
    a second integrator configured to receive the integrated signal and generate an output signal based on at least information associated with the integrated signal;
    a compensation capacitor coupled to the first integrator and the second integrator;
    a switch coupled to the compensation capacitor and configured to receive a control signal associated with the output signal;
    a first resistor coupled to the switch;
    a signal generator configured to receive a supply voltage and generate a first signal associated with a first amplitude, the first amplitude being proportional to a magnitude of the supply voltage;
    a comparator configured to receive the output signal and the first signal and generate a comparison signal based on at least information associated with the output signal and the first signal;
    a driver component configured to receive the comparison signal and the supply voltage and generate a second signal based on at least information associated with the comparison signal and the supply voltage;
    a first comparator configured to receive the output signal and a first reference signal and generate a first comparison signal; and
    a second comparator configured to receive the output signal and a second reference signal and generate a second comparison signal;
    wherein:
        the first integrator includes a first integration capacitor and a first operational amplifier including a first input terminal and a first output terminal, the first integration capacitor being coupled between the first input terminal and the first output terminal;
        the second integrator includes a second integration capacitor and a second operational amplifier including a second input terminal and a second output terminal, the second integration capacitor being coupled between the second input terminal and the second output terminal; and
        the compensation capacitor includes a first capacitor terminal and a second capacitor terminal, the first capacitor terminal being connected directly to the first output terminal of the first operational amplifier, the second capacitor terminal being connected directly to the second input terminal of the second operational amplifier;
    wherein:
        the switch is further coupled to the second input terminal of the second operational amplifier;
        the first resistor is further coupled to the second output terminal of the second operational amplifier;
        the switch is further configured to be open if the output signal satisfies one or more first predetermined conditions and to be closed if the output signal satisfies one or more second predetermined conditions; and
        the switch is further configured to be open if the output signal is within a predetermined range in magnitude and to be closed if the output signal is outside the predetermined range;
    wherein the predetermined range is associated with the first reference signal and the second reference signal.

2. The system of claim 1, and further comprising:
    an OR gate configured to receive the first comparison signal and the second comparison signal, and generate the control signal to close or open the switch based on at least information associated with the first comparison signal and the second comparison signal;
    wherein:
        if the control signal is at a first logic level, the switch is configured to be closed; and
        if the control signal is at a second logic level, the switch is configured to be open.

3. The system of claim 1, and further comprising:
    a feedback resistor coupled to the first input terminal and configured to receive a feedback signal associated with the output signal; and
    a compensation resistor coupled between the first output terminal and the second input terminal;
    wherein:
        the input signal and the output signal are associated with a transfer function; and
        the transfer function is determined according to the following equation:

$$H(s) = \frac{1 + s \times R_2 \times C_3}{s^2 \times R_1 \times R_2 \times C_1 \times C_2}$$

where H(s) represents the transfer function of the system, s represents a complex variable of a Laplace transform, $R_1$ represents a resistance of the feedback resistor, $R_2$ represents a resistance of the compensation resistor, $C_1$ represents a capacitance of the first integration capacitor, $C_2$ represents a capacitance of the second integration capacitor, and $C_3$ represents a capacitance of the compensation capacitor.

4. The system of claim 1 wherein:
the driver component includes:

a gate driver configured to receive the comparison signal and generate a drive signal;
a first transistor; and
a second transistor coupled to the first transistor;
wherein the first transistor and the second transistor are configured to receive the drive signal and the supply voltage and generate the second signal.

5. A system for amplifying a first input signal to generate a first output signal, the system comprising:
a first integrator configured to receive a first input signal and generate a first integrated signal based on at least information associated with the first input signal;
a second integrator configured to receive the first integrated signal and generate a second integrated signal based on at least information associated with the first integrated signal;
a compensation capacitor coupled directly to the first integrator and coupled directly to the second integrator;
a switch coupled to the compensation capacitor and configured to receive a control signal associated with the second integrated signal;
a first resistor coupled to the switch;
a signal generator configured to receive a supply voltage and generate a first signal associated with a first amplitude, the first amplitude being proportional to a magnitude of the supply voltage;
a modulation and drive component configured to receive the second integrated signal, the first signal and the supply voltage and generate a first output signal based on at least information associated with the second integrated signal, the first signal and the supply voltage;
a first comparator configured to receive the second integrated signal and a first reference signal and generate a first comparison signal; and
a second comparator configured to receive the second integrated signal and a second reference signal and generate a second comparison signal;
wherein:
the first integrator includes a first integration capacitor and a first operational amplifier including a first input terminal and a first output terminal, the first integration capacitor being coupled between the first input terminal and the first output terminal; and
the second integrator includes a second integration capacitor and a second operational amplifier including a second input terminal and a second output terminal, the second integration capacitor being coupled between the second input terminal and the second output terminal;
wherein:
the switch is further coupled to the second input terminal of the second operational amplifier;
the first resistor is further coupled to the second output terminal of the second operational amplifier;
the switch is further configured to be open if the second integrated signal satisfies one or more first predetermined conditions and to be closed if the second integrated signal satisfies one or more second predetermined conditions; and
the switch is further configured to be open if the second integrated signal is within a predetermined range in magnitude and to be closed if the second integrated signal is outside the predetermined range;
wherein the predetermined range is associated with the first reference signal and the second reference signal.

6. The system of claim 5, and further comprising:
an OR gate configured to receive the first comparison signal and the second comparison signal, and generate the control signal to close or open the switch based on at least information associated with the first comparison signal and the second comparison signal;
wherein:
if the control signal is at a first logic level, the switch is configured to be closed; and
if the control signal is at a second logic level, the switch is configured to be open.

7. The system of claim 5 wherein the modulation and drive component includes:
a third comparator coupled to the second integrator;
a gate driver coupled to the third comparator;
a first transistor coupled to the gate driver; and
a second transistor coupled to the gate driver;
wherein:
the first transistor includes a first transistor terminal, a second transistor terminal and a third transistor terminal;
the second transistor includes a fourth transistor terminal, a fifth transistor terminal, and a sixth transistor terminal; and
the third transistor terminal and the fourth transistor terminal are coupled together and configured to output the first output signal.

8. The system of claim 7 wherein the first transistor terminal is biased at the supply voltage.

9. The system of claim 5 wherein:
the first input signal includes a second input signal and a second output signal, the second input signal being associated with an audio input signal, the second output signal being associated with the first output signal; and
the system is further configured to integrate and modulate the second input signal and the second output signal to generate the first output signal.

10. The system of claim 5, and further comprising:
a feedback resistor coupled to the first input terminal and configured to receive the first output signal; and
a compensation resistor coupled between the first output terminal and the second input terminal;
wherein:
the first input signal and the first output signal are associated with a transfer function; and
the transfer function is determined according to the following equation:

$$H(s) = \frac{1 + s \times R_2 \times C_3}{s^2 \times R_1 \times R_2 \times C_1 \times C_2}$$

where H(s) represents the transfer function of the system, s represents a complex variable of a Laplace transform, $R_1$ represents a resistance of the feedback resistor, $R_2$ represents a resistance of the compensation resistor, $C_1$ represents a capacitance of the first integration capacitor, $C_2$ represents a capacitance of the second integration capacitor, and $C_3$ represents a capacitance of the compensation capacitor.

* * * * *